(12) United States Patent
Yu

(10) Patent No.: US 6,465,315 B1
(45) Date of Patent: Oct. 15, 2002

(54) MOS TRANSISTOR WITH LOCAL CHANNEL COMPENSATION IMPLANT

(75) Inventor: Bin Yu, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/476,527

(22) Filed: Jan. 3, 2000

(51) Int. Cl.⁷ ............................................. H01L 21/336
(52) U.S. Cl. ...................... 438/306; 438/286; 438/289; 438/302; 438/527
(58) Field of Search .................. 438/217, 229–232, 438/286, 289–291, 301–303, 305–307, 525, 527, 529

(56) References Cited

U.S. PATENT DOCUMENTS

| | | | |
|---|---|---|---|
| 4,683,645 A | 8/1987 | Naguib et al. | 438/297 |
| 5,393,685 A | 2/1995 | Yoo et al. | 438/231 |
| 5,532,508 A * | 7/1996 | Kaneko et al. | 257/336 |
| 5,593,907 A | 1/1997 | Anjum et al. | 438/298 |
| 5,607,884 A | 3/1997 | Byun | 438/297 |
| 5,763,916 A * | 6/1998 | Gonzalez et al. | 257/345 |
| 5,780,902 A * | 7/1998 | Komuro | 257/344 |
| 5,793,090 A | 8/1998 | Gardner et al. | 257/408 |
| 5,811,323 A | 9/1998 | Miyasaka et al. | 438/151 |
| 5,811,338 A * | 9/1998 | Kao et al. | 438/286 |
| 5,825,066 A | 10/1998 | Buynoski | 257/345 |
| 6,030,869 A * | 2/2000 | Odake et al. | 438/266 |
| 6,031,272 A * | 2/2000 | Hiroki et al. | 257/404 |
| 6,225,174 B1 * | 7/2001 | Yu | 438/286 |

FOREIGN PATENT DOCUMENTS

JP 6-21476 A * 1/1994

* cited by examiner

Primary Examiner—Carl Whitehead, Jr.
Assistant Examiner—Janie J. Brophy

(57) ABSTRACT

A method of fabricating an integrated circuit with a source side compensation implant utilizes tilt-angle implants. An asymmetric channel profile is formed in which less dopants are located on a source side. The process can be utilized for P-channel or N-channel metal oxide field semiconductor effect transistors (MOSFETS).

19 Claims, 2 Drawing Sheets

MOS TRANSISTOR WITH LOCAL CHANNEL COMPENSATION IMPLANT

CROSS REFERENCE TO RELATED APPLICATIONS

This patent application is related to U.S. application Ser. No. 09/187,630, filed on Nov. 6, 1998 by Yu, titled "Dual Amorphization Implant Process for Ultra-Shallow Drain and Source Extensions" and U.S. application Ser. No. 09/476,961 by Yu, on an even date herewith titled "MOS Transistor with Asymmetrical Source/Drain Extensions." Both applications are assigned to the assignee of the present invention.

FIELD OF THE INVENTION

The present invention relates to integrated circuits and methods of manufacturing integrated circuits. More particularly, the present invention relates to a transistor and a method of manufacturing it. The transistor includes a local compensation implant.

BACKGROUND OF THE INVENTION

Integrated circuits (ICs), such as, ultra-large scale integrated (ULSI) circuits, can include as many as one million transistors or more. The ULSI circuit can include complementary metal oxide semiconductor (CMOS) field effect transistors (FETS). The transistors can include semiconductor gates disposed between drain and source regions. The drain and source regions are typically heavily doped with a P-type dopant (boron) or an N-type dopant (phosphorous).

The drain and source regions generally include a thin extension that is disposed partially underneath the gate to enhance the transistor performance. Shallow source and drain extensions help to achieve immunity to short-channel effects which degrade transistor performance for both N-channel and P-channel transistors. Short-channel effects can cause threshold voltage roll-off and drain-induced barrier-lowering. Shallow source and drain extensions and, hence, controlling short-channel effects, are particularly important as transistors become smaller.

Conventional techniques utilize a double implant process to form shallow source and drain extensions. According to the conventional process, the source and drain extensions are formed by providing a transistor gate structure without sidewall spacers on a top surface of a silicon substrate. The silicon substrate is doped on both sides of the gate structure via a conventional doping process, such as, a diffusion process or an ion implantation process. Without the sidewall spacers, the doping process vertically introduces dopants into a thin region (i.e., just below the top surface of the substrate) to form the drain and source extensions as well as to partially form the drain and source regions.

After the drain and source extensions are formed, silicon dioxide spacers, which abut lateral sides of the gate structure, are provided over the source and drain extensions. The substrate is vertically doped a second time to form the deeper source and drain regions. The source and drain extensions are not further doped due to the blocking capability of the silicon dioxide spacer.

As transistors disposed on integrated circuits (ICs) become smaller, and critical dimensions of MOSFETS are reduced, proper design and engineering of channel doping profiles becomes more critical to the operation of small-scale transistors. For example, optimized channel doping profiles can provide excellent immunity to short-channel effects, such as threshold voltage roll-off and drain induced barrier lowering. Immunity to short-channel effects can make devices robust with respect to random process variations (especially gate length variations). For example, in a MOSFET with a uniformly doped channel (without any channel profile engineering), the threshold voltage ($V_{th}$) drops rapidly as gate length (Lg) is reduced.

Generally, the suppression of short-channel effects is related to the lateral non-uniformity of the channel doping profile (e.g., the ratio between the peak concentration of the pocket region and the channel doping concentration). The peak concentration of the pocket region is maximized by utilizing a high dosage of dopants when performing the pocket implant.

One form of channel dopant profile engineering which is widely employed in deep MOSFET fabrication processes utilizes pocket implant regions. However, conventional pocket implant techniques can have significant drawbacks. As stated above, conventional pocket implants can require a high dosage of dopants (dosages of greater than $10^{13}$ dopants per cm squared) to suppress short channel-channel effects. The high dosage associated with the pocket implant can degrade transistor drive current. In addition, when large tilt angle pocket implants are used, the high dosage can cause significant gate depletion effect which also degrades transistor drive current.

The high dosage associated with the pocket implant also can raise the threshold voltage of the transistor. In transistors which use mid-gap metal materials (Tungsten (W), Molybdenum (Mo), and Titanium Nitride (TiN)) as gate conductors, a raised threshold voltage can be problematic. Transistors using mid-gap metals as gate conductors have a larger work function than doped polysilicon. Therefore, pocket implant dosages which are acceptable for polysilicon gate transistors may not be acceptable for mid-gap metal gate transistors because the threshold voltage becomes too large.

Thus, there is a need for a transistor with optimized channel profile engineering without requiring a high dosage pocket implant. Further, there is a need for a method of manufacturing a transistor that is not susceptible to short-channel effects and yet does not utilize a high dosage pocket implant. Further still, there is a need for transistors that have a high ratio between peak dopant concentration in the pocket region and the dopant concentration in the channel region and yet has suitable drive current and threshold voltage characteristics. Even further still, there is a need for a mid-gap metal transistor with channel profile engineering and a method of manufacturing such a transistor.

SUMMARY OF THE INVENTION

An exemplary embodiment relates to a method of manufacturing an integrated circuit. The method includes providing a gate structure between a source location and a drain location in a semiconductor substrate. The method also includes providing an angled channel compensation implant in the direction from source location to the drain location, and providing a dual angled pocket implant. The method also includes providing a source/drain extension implant at the source location and the drain location, providing a pair of spacers abutting lateral sides of the gate structure, and providing a deep source/drain implant at the source location and the drain location.

Another exemplary embodiment relates to a method of manufacturing an ultra-large scale integrated circuit including a plurality of field effect transistors. The method includes steps of providing at least part of a gate structure on a top surface of a semiconductor substrate, forming a source side channel compensation region with dopants of a first conductivity type, forming a pocket region with dopants of a second conductivity type, and forming source and drain regions with dopants of the first conductivity type. The first conductivity type is opposite the second conductivity type. The gate structure is between the source and drain regions. A channel underneath the gate structure has a lower concentration of dopants of the second conductivity type on a side closer to the source region than on a side closer to the drain region.

Another exemplary embodiment relates to an integrated circuit including a plurality of field effect transistors. Each of the transistors includes a gate structure disposed over a channel, a source side channel compensation region in the channel, a deep source region, a deep drain region, a source extension, a drain extension, a first pocket region, and a second pocket region. The source side channel compensation region is lightly doped with dopants of a first conductivity type. The deep source region and deep drain region are heavily doped with dopants of a second conductivity type. The source extension is integral with the deep drain region, and the drain extension is integral with the deep drain region. The first pocket region is disposed between the channel and the drain extension. The second pocket region is disposed between the source extension and the source side compensation region. The first pocket region and the second region are doped with dopants of the first conductivity type.

BRIEF DESCRIPTION OF THE DRAWINGS

Exemplary embodiments will hereafter be described with reference to the accompanying drawings wherein like numerals denote like elements, and.

DETAILED DESCRIPTION OF THE PREFERRED EXEMPLARY EMBODIMENTS

Figure 1:
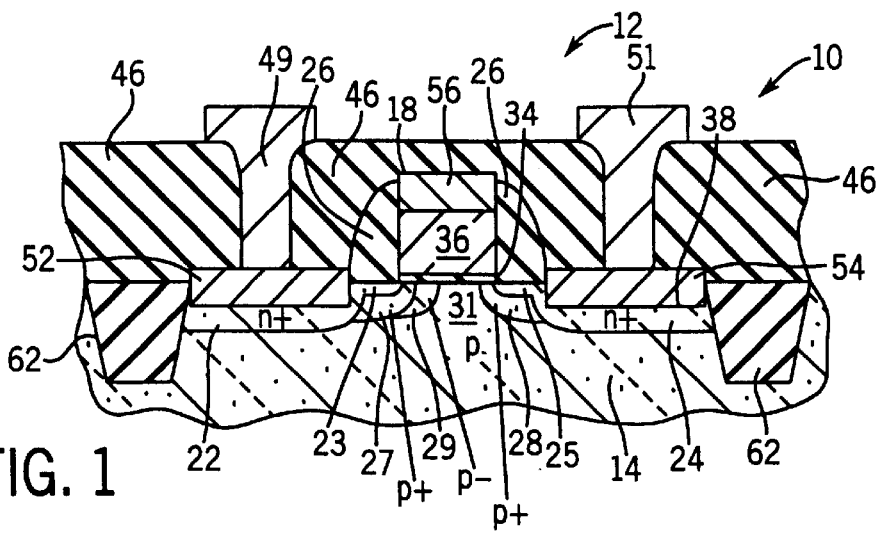
FIG. 1 is a cross-sectional view of a portion of an integrated circuit having a transistor with an optimized channel profile in accordance with an exemplary embodiment.

With reference to FIG. 1, a transistor 12 is disposed on a semiconductor substrate 14, such as, a single crystal silicon wafer. Transistor 12 is part of a portion 10 of an integrated circuit (IC) manufactured on a wafer (such as, a silicon wafer). Transistor 12 can be an N-channel or a P-channel field effect transistor, such as, a metal oxide semiconductor field effect transistor (MOSFET). Transistor 12 is described below as an N-channel transistor unless otherwise noted.

Transistor 12 includes a gate structure 18, a source region 22, and a drain region 24. Transistor 12 also includes a source extension 23 and a drain extension 25. Transistor 12 is between insulative structures 62.

Gate structure 18 includes a gate oxide 34, and a gate conductor 36. Gate structure 18 can also include a pair of insulative spacers 26. Gate structure 18 is above a channel 31 of substrate 14. Channel 31 is doped to a concentration of $1-5 \times 10^7$ P-type dopants per centimeter cubed for an N-channel transistor.

Extensions 23 and 25 are preferably ultra-shallow extensions (e.g., junction depth is less than 30 nanometers (nm)), which are thinner than regions 22 and 24. Extensions 23 and 25 are integral or connected with regions 22 and 24, respectively, and are disposed partially underneath gate oxide 34. Ultra-shallow extensions 23 and 25 help transistor 12 achieve substantial immunity to short-channel effects. Short-channel effects can degrade performance of transistor 12 as well as the manufacturability of the IC associated with transistor 12. Regions 22 and 24 and hence extensions 23 and 25 have a concentration of $10^{19}$ to $10^{20}$ dopants per cubic centimeter (heavily doped, P+ or N+).

Pocket implant regions 27 and 28 are situated below extensions 23 and 25, respectively. Regions 27 are preferably doped opposite to extensions 23 and 25 at a concentration of $1-5 \times 10^{18}$ dopants per cubic centimeter. Peak concentration of regions 27 and 28 are located 30–50 nm below a top surface 38 of substrate 14. Pocket implant regions 27 and 28 are provided below extensions 23 and 25 to prevent source/drain punch-through in depletion regions. Pocket regions 27 and 28 are implanted to achieve additional immunity to short-channel effects. Regions 27 and 28 are preferably implanted by an ion implantation technique and include opposite dopants to the dopants utilized in regions 22 and 24. Accordingly, an appropriate dopant for pocket regions 27 and 28 in an N-channel transistor is boron, boron diflouride, or iridium, and an appropriate dopant for pocket regions 27 and 28 in a P-channel transistor is arsenic, phosphorous, or antimony.

Transistor 12 also includes a source side local channel compensation region 29. Compensation region 29 reduces the local channel doping concentration on the source side of channel 31 and thereby increases the lateral non-uniformity of the channel doping profile. Accordingly, short channel performance of transistor 12 is improved by the use of region 29. Region 29 is preferably doped to a concentration of $1-5 \times 10^{16}$ dopants per centimeter squared. The dopants are P-type for an N-channel transistor.

Short channel effects associated with transistor 12 as well as the threshold voltage is mainly determined by the channel potential barrier height near the channel-to-source metallurgical junction. Accordingly, a reduced potential barrier caused by region 29 effectively reduces short channel effects and yet does not increase the threshold voltage associated with transistor 12. Region 29 allows the ratio of the pocket peak concentration or total dose associated with the implants to be as low as possible so that degradation of drive current of transistor 12 is avoided. Source side local channel compensation region 29 is preferably located within channel 31 between pocket regions 27 and 28. Pocket region 27 is located between compensation region 29 and source extension 23, and pocket region 28 is located between channel 31 and drain extension 25. A source side of channel 31 has a lower concentration of dopants of the opposite conductivity type to the dopants in source and drain regions 22 and 24, respectively.

Transistor 12 can be at least partially covered by an insulative layer 46 and is preferably part of an ultra-large scale integrated (ULSI) circuit that includes one million or more transistors. Conductive vias 49 and 51 are provided through layer 46 and contact silicide layers 52 and 54, respectively.

Gate structure 18 also includes a silicide layer 56 above gate conductor 36. Spacers 26 can be a silicon nitride ($Si_3N_4$) or silicon dioxide ($SiO_2$) material. Gate oxide 34 is preferably thermally grown on substrate 14. Conductor 36 is preferably a metal conductor deposited by chemical vapor deposition (CVD) and etched to form the particular structure for transistor 12. Conductor 36 can be a mid-gap metal conductor. Alternatively, conductor 36 can be polysilicon. Spacers 26 are preferably formed by depositing a layer and planarizing and etching to leave spacers 26.

Figure 7:
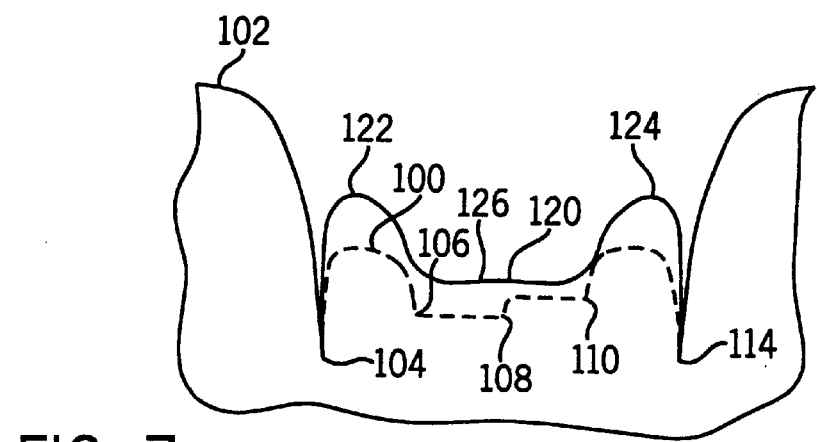
FIG. 7 is a drawing showing the lateral channel doping profiles of the portion of the integrated circuit illustrated in FIG. 1 and of a conventional MOSFET.

With reference to FIG. 7, a channel doping profile associated with (an N-channel MOSFET) is shown. A dashed line 100 represents the concentration of dopants across transistor 12 from extension 23 to extension 25 (FIG. 1). Solid line 102 represents the concentration of dopants in extensions 23 and 25 of transistor 12 and in a conventional transistor between its extensions.

Assuming transistor 12 is an N-channel transistor and starting at a left side of solid line 102 in FIG. 7, line 102 represents extension 23 (FIG. 1) which is an N+ region having a concentration of dopants of between $10^{19}$–$10^{21}$ dopants (preferably $10^{20}$) per cubic centimeter. Solid line 102 reaches a point 104 representing the junction between region 27 and extension 23. To the right of point 104, dashed line 100 represents region 27 which is a P+ region having a concentration of 1–5×$10^{18}$ P-type dopants per cubic centimeter. To the right of a point 106 representing a junction between region 29 and region 27, line 100 represents region 29 which is a P-region having a concentration of 1–5×$10^{16}$ P-type dopants per cubic centimeter. To the right of a point 108 representing a junction between channel 31 and region 29, line 100 represent channel 31 which has the same dopant concentration as substrate 14 (1–5×$10^{17}$ P-type dopants per cubic centimeter). To the right of a point 110 representing a junction between channel 31 and region 28, line 100 represents region 28 which is a P+ region having a concentration of 1–5×$10^{18}$ P-type dopants per cubic centimeter. To the right of a point 114 representing a junction between extension 15 and region 28, line 100 represents extension 15 which is a N+ region having a concentration of 1×$10^{19-21}$ N-type dopants per cubic centimeter. Conversely, a P-channel transistor would have a similar concentration wherein P-type dopants are exchanged for N-type dopants.

With reference to FIG. 7, a solid line 122 between points 104 and 114 represents a conventional channel doping profile between extensions 23 and 25. As shown in FIG. 7, a higher concentration of dopants is associated with conventional pocket regions at points 122 and 124 compared to regions 27 and 28. In addition, the level of dopants between points 122 and 124 is uniform and symmetrical between points 104 and 114 throughout a region 126. In contrast, line 100 represents an asymmetric profile where less dopants are located on a source-side region of channel 31.

With reference to FIGS. 1–7, the fabrication of transistor 12, including source extension 23 and drain extension 25 and regions 27, 28 and 29 is described below as follows. The advantageous process allows a lower dosage implant for pocket regions 27 and 28 to be utilized.

Figure 2:
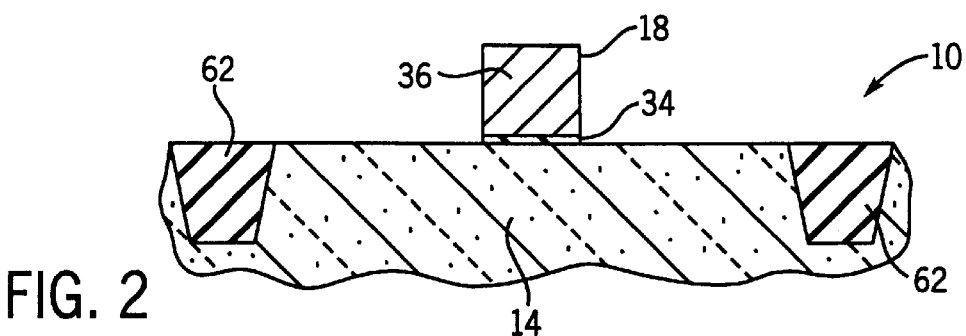
FIG. 2 is a cross-sectional view of the portion of the integrated circuit illustrated in FIG. 1, showing a gate structure formation step.

In FIG. 2, transistor 12 can be substantially formed by conventional semiconductor processing techniques to form gate structure 18 including gate oxide 34 and gate conductor 36. Conventional LOCOS or shall trench isolation processes can be used to form insulative structures 62.

Gate structure 18 is formed on substrate 14 which is doped with 1–5×$10^{17}$ P-type dopants per cubic centimeter, assuming an N-channel transistor. Gate structure 18 can be formed by depositing or growing a dielectric layer on substrate 14 and a metal or polysilicon layer over the dielectric layer and etching to leave conductor 36 and oxide 34 via a lithographic process.

Figure 3:
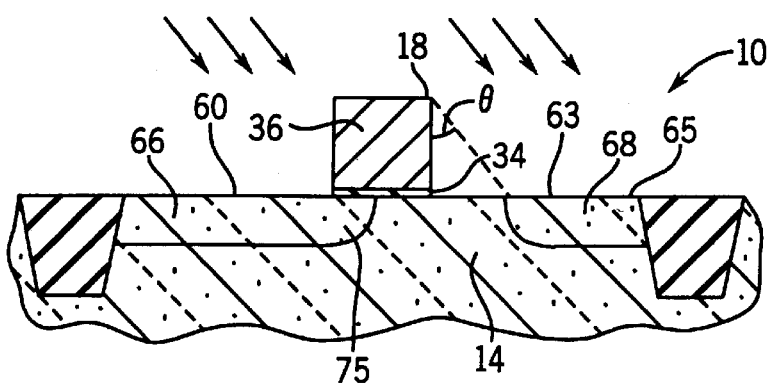
FIG. 3 is a cross-sectional view of the portion of the integrated circuit illustrated in FIG. 1, showing a tilt angle channel compensation implant step.

In FIG. 3, substrate 14 is subjected to a large angle (e.g., 30–60°) tilt N-type implant from a source location side 60 to a drain location side 63. Preferably, an N-type dopant such as phosphorous is accelerated to an energy to 10–20 kev and implanted at an angle between 30–60° from top surface 65 to form N-type regions 66 and 68. Due to the tilt angle associated with the implant, region 66 extends underneath gate structure 18 while region 68 is set apart from gate structure 18. The shadowing effect associated with gate structure 18 protects drain location side 63 from the N-type dopants. Preferably, the implant provides a dosage of 2×$10^{12}$–8×$10^{12}$ N-type dopants per centimeter squared.

Figure 4:
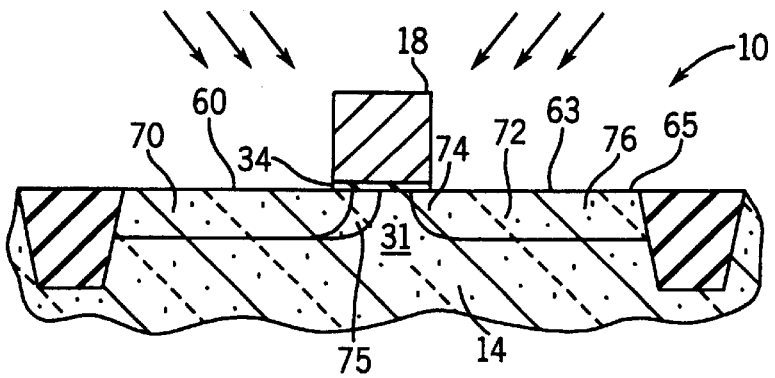
FIG. 4 is a cross-sectional view of the portion of the integrated circuit illustrated in FIG. 1, showing a tilt angle pocket implant step.

In FIG. 4, substrate 14 is subjected to a 4-quad implant or 4 rotation pocket implant. Substrate 14 is rotated to provide a dopant implant between an angle of 30–60° in four different directions. As shown in FIG. 4, two of the four directions extend from source side 60 to gate 18 and from drain side 63 to gate structure 18. The other two directions include a direction into the cross-sectional view of FIG. 4 and out of the cross sectional view of FIG. 4. Preferably, the pocket implant produces a P-type region 70 and a P-type region 72 (associated with regions 27 and 28 in FIG. 1). Preferably, a large angle tilt pocket implant (e.g., 30–60° from top surface 65) provides P-type dopants (e.g., boron or boron diflouride ($BF_2$)) accelerated at an energy of 5–15 kev at a dosage of 8×$10^{12}$–4×$10^{13}$ P-type dopants per centimeter squared. Portion 75 of region 66 (FIG. 4) remains after the pocket implant. Region 66 is formed at a higher energy than region 70 so portion 75 is not affected by the pocket implant.

Figure 5:
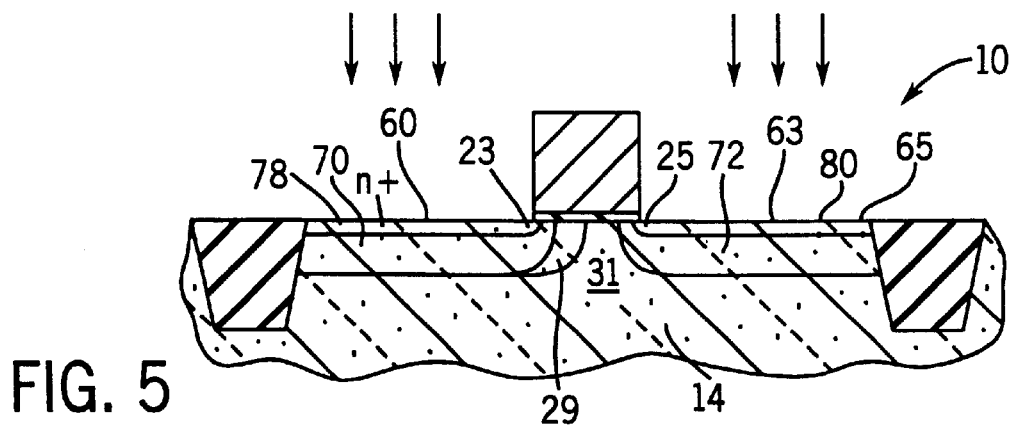
FIG. 5 is a cross-sectional view of the portion of the integrated circuit illustrated in FIG. 1, showing a source/drain extension doping implant step.

In FIG. 5, substrate 14 is subjected to a source/drain extension implant. Preferably, N-type dopants, such as arsenic, are accelerated at an energy of 1–3 Kev at a dosage of 5×$10^{14}$–1×$10^{15}$ into source location 60 and drain location 63 of substrate 14. Preferably, the implant occurs at an angle of 90° (vertical) with respect to top surface 65 of substrate 14 and forms regions 78 and 80. Regions 78 and 80 are preferably less than 6–10 nm thick (as implanted).

Figure 6:
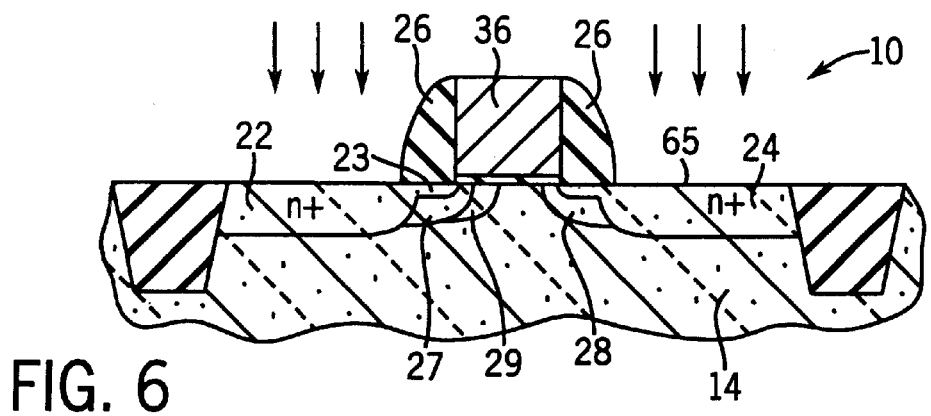
FIG. 6 is a cross-sectional view of the portion of the circuit illustrated in FIG. 1, showing an oxide spacer formation step and a deep source/drain region doping implant step.

In FIG. 6, spacers 26 are formed in a conventional deposition and etched back process. Preferably, spacers 26 are silicon dioxide or silicon nitride spacers. After spacers 26 are formed, a deep source/drain implant is provided at an angle of 90° with respect to top surface 65 of substrate 14. The deep source/drain implant is provided as an energy level of 15 KeV–40 KeV for As and a dosage of 14×$10^{15}$ dopants per centered squared. Preferably, the source drain implant forms source region 22 and drain region 24 having a concentration of $10^{19-21}$ dopants per centimeter cubed. After the deep source drain implant, substrate 14 is subjected to a rapid thermal anneal to activate dopants in regions 22, 23, 24, 25, 27, 28 and 29.

In FIG. 1, silicide layers 52 and 56 are formed in a silicidation process. Insulative layer 46 is deposited by a tetraethylorthosilicate (TEOS) process. Conductive vias 49 and 51 can be formed in layer 46. Conventional CMOS processes can be utilized to form other structures associated with portion 10 including interconnects, metal layers or other structures.

It is understood that, while preferred embodiments, examples, materials, and values are given, they are for the purpose of illustration only. The apparatus and method of the invention are not limited to the precise details and conditions disclosed. For example, although certain implant characteristics are discussed, other methods could be utilized to dope the various regions. Thus, changes may be made to the details disclosed without departing from the spirit of the invention, which is defined by the following claims.

What is claimed is:

1. A method of manufacturing an integrated circuit, comprising:

providing a gate structure between a source location and a drain location in a semiconductor substrate;

providing an angled channel compensation implant in a direction from the source location to the drain location to provide dopants underneath a source side of the gate structure but not underneath a drain side of the gate structure;

providing a dual angled pocket implant in a direction from the source location to the gate structure and from the drain location to the gate structure to provide dopants underneath both sides of the gate structure;

providing a source/drain extension implant from the source location and the drain location;

providing a pair of spacers abutting lateral sides of the gate structure; and providing a deep source/drain implant at the source location and the drain location.

2. The method of claim 1, wherein a pocket region formed by the dual angled pocket implant is between a compensation region formed by the angled channel compensation implant and a source extension formed by the source/drain extension implant.

3. The method of claim 2, wherein the compensation region has a lower concentration of dopants than the source extension.

4. The method of claim 1, wherein the providing the source/drain extension implant step and the providing the deep source/drain implant step are performed at a 90° angle with respect to the substrate.

5. The method of claim 3, wherein the compensation region has a lower concentration of dopants than the pocket region.

6. The method of claim 1, wherein the gate structure includes a gap-metal conductor.

7. The method of claim 1, wherein the angled channel compensation implant is performed at an angle between 30 and 60 degrees.

8. The method of claim 1, wherein the source/drain extension implant forms extensions having a depth of less than 30 nm from a top surface of the substrate.

9. The method of claim 6, wherein the angled channel compensation implant is performed at an angle between 30 to 60 degrees with respect to the substrate.

10. A method of manufacturing an ultra-large scale integrated circuit including a plurality of field effect transistors, the method comprising steps of:

providing at least part of a gate structure on a top surface of a semiconductor substrate;

forming a source side channel compensation region with dopants of a first conductivity type;

forming a pocket region with dopants of a second conductivity type, the first conductivity type being opposite the second conductivity type;

providing a source/drain extension implant;

providing a pair of spacers abutting lateral sides of the gate structure; and providing a deep source/drain implant at a source location and a drain location to form source and drain regions with dopants of the first conductivity type, wherein the gate structure is between the source and drain regions, whereby a channel underneath the gate structure has a lower concentration of dopants of the second conductivity type on a side closer to the source region than on a side closer to the drain region.

11. The method of claim 10 wherein the pocket region is between the source side channel compensation region and a source extension formed by the source/drain extension implant.

12. The method of claim 10, wherein the pocket region is formed in a low dosage implant process.

13. The method of claim 10, wherein the pocket region is formed at an energy level of between 5–15 KeV.

14. The method of claim 10, wherein the source side channel compensation region is formed at an energy level of between 10–20 KeV.

15. The method of claim 10, wherein the first conductivity type is N-type and the second conductivity type is P-type.

16. The method of claim 10, wherein the first conductivity type is P-type and the second conductivity type is N-type.

17. A method of manufacturing transistors, the method comprising:

providing at least part of a gate structure on a top surface of a substrate;

forming a source side channel compensation region with dopants of a first conductivity type;

forming a pocket region with dopants of a second conductivity type, the first conductivity type being opposite the second conductivity type;

providing a source/drain extension implant;

providing a pair of spacers abutting lateral sides of the gate structure;

providing a deep source/drain implant at a source location and a drain location;

to form source and drain regions with dopants of the first conductivity type, wherein the gate structure is between the source and drain regions, whereby a channel underneath the gate structure has a lower concentration of dopants of the second conductivity type on a side closer to the source region than on a side closer to the drain region.

18. The method of claim 17, wherein the pocket region is between the source side channel compensation region and a source extension formed by the source/drain extension implant, wherein the source side channel compensation region has a concentration of dopants less than the concentration of dopants in the pocket region and in the source extension.

19. The method of claim 18, wherein the pocket region is formed in a low dosage implant process.

* * * * *